United States Patent [19]
Fidalgo et al.

[11] Patent Number: 5,690,773
[45] Date of Patent: Nov. 25, 1997

[54] METHOD FOR THE MANUFACTURE OF A CONTACT-FREE OR HYBRID CARD

[75] Inventors: Jean Christophe Fidalgo, Gemenos; Christiane Oi, Trets, both of France

[73] Assignee: Gemplus Card International, Gemenos Cedex, France

[21] Appl. No.: 393,108

[22] Filed: Feb. 22, 1995

[30] Foreign Application Priority Data

Feb. 24, 1994 [FR] France ................................ 94 02130

[51] Int. Cl.⁶ .................. B29C 39/10; B32B 31/06; B32B 31/18; G06K 19/077
[52] U.S. Cl. .................. 156/267; 156/297; 156/300; 235/488; 235/491; 235/492; 257/679; 257/687; 264/138; 264/157; 264/263; 264/272.13; 264/272.15; 264/272.17; 283/83; 283/904
[58] Field of Search .................. 264/272.15, 272.17, 264/138, 263, 272.13, 157, 272.11, 294; 235/488, 491–492; 902/26, 29; 257/679, 687; 437/214–216, 219; 156/242, 267, 250, 299, 300, 297; 283/83, 904

[56] References Cited

U.S. PATENT DOCUMENTS 5,399,847  3/1995  Droz ................................ 235/492 X

FOREIGN PATENT DOCUMENTS

| 0564051 | 10/1993 | European Pat. Off. |
| 0570784 | 11/1993 | European Pat. Off. |
| 0640940 | 3/1995 | European Pat. Off. ........ 235/492 |
| 2622323 | 4/1989 | France. |
| 2665280 | 1/1992 | France. |
| 4243654 | 7/1993 | Germany. |
| 4311493 | 10/1994 | Germany ........................ 235/492 |
| 2-30597 | 1/1990 | Japan ............................. 283/83 |
| 9422110 | 9/1994 | WIPO ............................ 235/492 |
| 9422111 | 9/1994 | WIPO ............................ 235/492 |

*Primary Examiner*—Adrienne C. Johnstone
*Attorney, Agent, or Firm*—Nilles & Nilles S.C.

[57] ABSTRACT

A method for the manufacture of a contact-free card comprising a card body and an electronic module having an integrated circuit chip connected to an antenna, a frame is deposited on a lower thermoplastic sheet demarcating the edges of a cavity; the electronic module is positioned at the bottom of the cavity; this cavity is filled with a polymerizable resin; and the frame and the resin-filled cavity are covered with an upper thermoplastic sheet to which slight pressure is applied. The resin polymerizes, and the card is cut out within the frame.

15 Claims, 3 Drawing Sheets

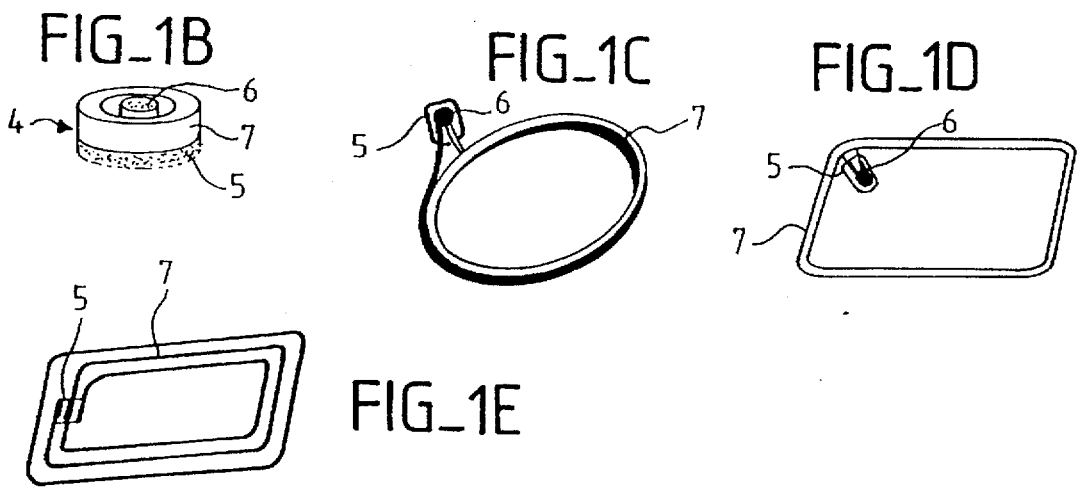
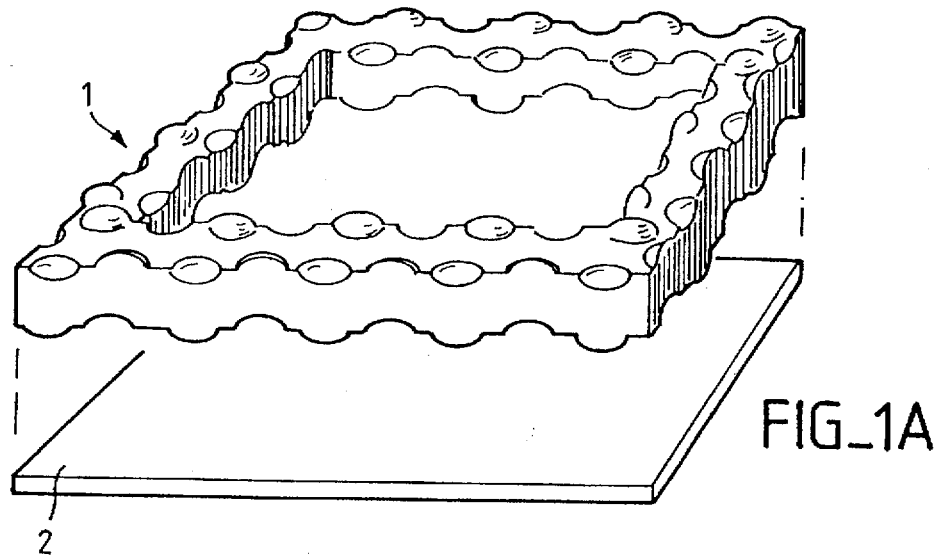
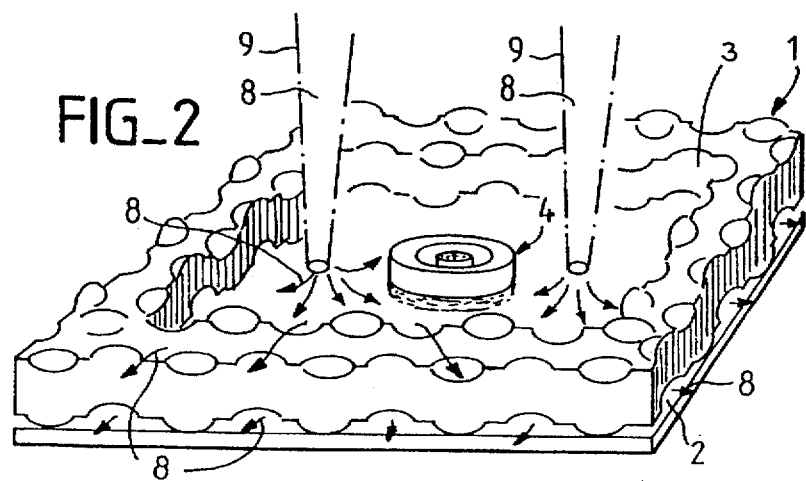

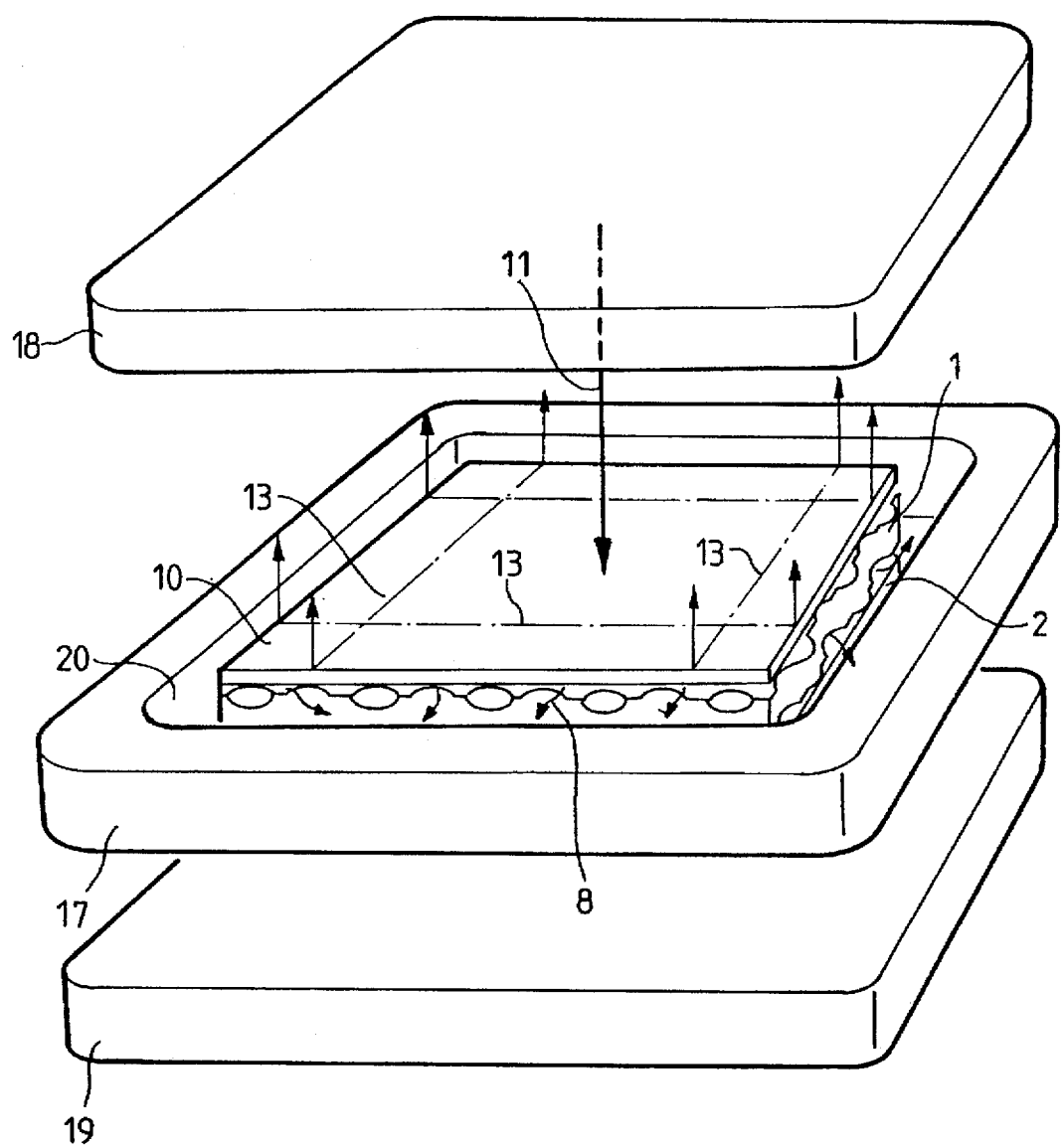
FIG_3A
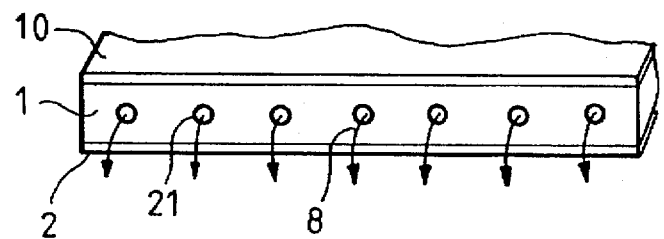
FIG_3B

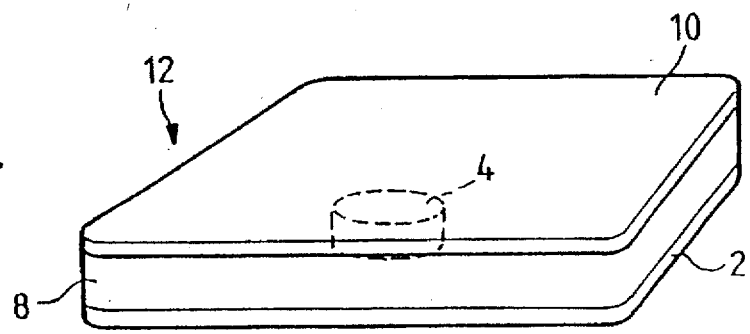
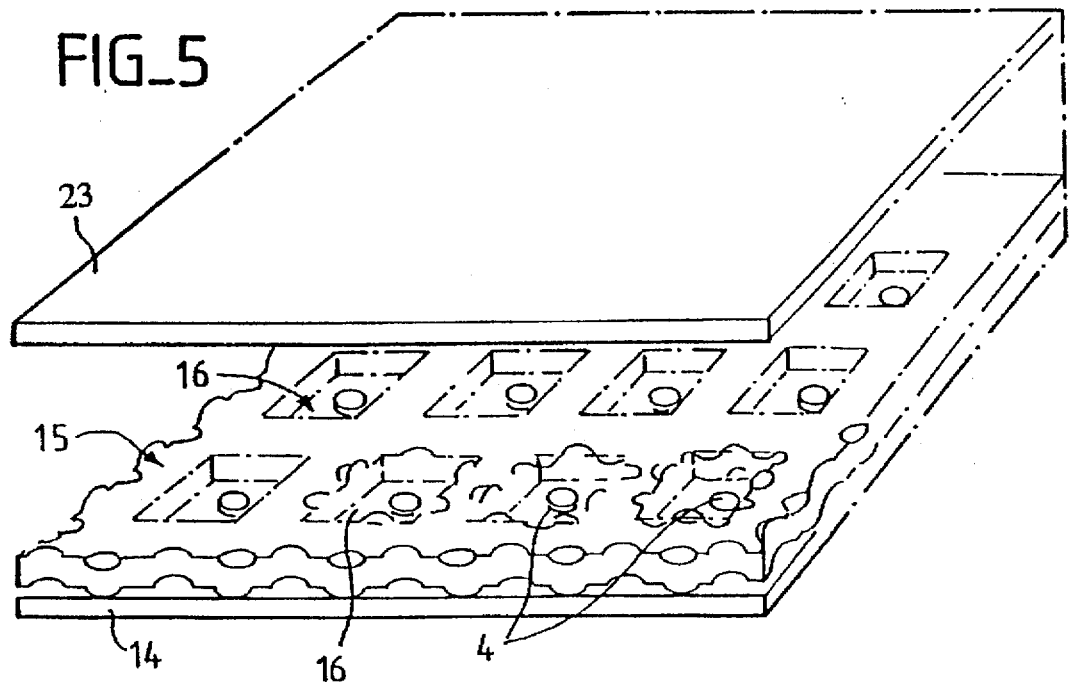

METHOD FOR THE MANUFACTURE OF A CONTACT-FREE OR HYBRID CARD

BACKGROUND OF THE INVENTION

1. Field of the Invention

The invention relates to a method for the manufacture of a contact-free card provided with an electronic module comprising an integrated circuit chip connected to an antenna. Such cards are designed to carry out various operations such as, for example, banking operations, telephone communications or various identification operations. These operations are performed by means of a remote electromagnetic coupling between the electronic module of the card and a receiver apparatus or reader. The coupling can be done in read mode or in read/write mode.

The invention does not relate solely to cards that work exclusively without making contact. It also relates to combined or hybrid cards that have the possibility of working in two modes: without making contact and with making contact. These hybrid cards are designed, for example, for remote cash operations in which a certain number of units are deducted from them remotely when they pass in the vicinity of a terminal (contact-free operation), and in which they are recharged in a dispenser that is compatible with standard chip cards (operation with contacts).

In the form in which they are made at present, contract-free cards are portable objects with standardized dimensions. The usual ISO 7810 standard corresponds to a card with a standard format having a length of 85 mm, a width of 54 mm and a thickness of 0.76 mm. Each card has a card body constituted by an assembling of plastic sheets or leaves and, embedded in this assembly, an electronic module containing an integrated circuit chip connected to an inductance coil type of antenna by at least two connection terminals. The chip has a memory and could, in certain cases, include a microprocessor. The dimensions of the electronic module are substantially smaller than those of the card. The position of the electronic module in the card is of only minor importance in regard to contact-free cards. However, this parameter is a major parameter when the resistance of the card to mechanical bending or twisting forces is considered. Indeed, to minimize the strains transmitted to the module, it is preferable to position it in one of the corners of the card.

2. Description of the Prior Art

There are known ways of making contact-free cards by the hot colamination technique. These methods consist of placing, between the two plates of a press, a stack of thermoplastic sheets in the middle of which the contact-free electronic module is positioned. The different thermoplastic sheets are then soldered by the application of pressure and temperature.

Owing to the differences between the expansion coefficients of the materials used, the combined action of the pressure and of the temperature generates a residual deformation on the surface of the card before the electronic module. The card obtained is not aesthetically satisfactory.

There are known methods for making contact-free cards in which a frame, for example a rectangular, circular or oblong frame, is deposited on a lower thermoplastic sheet, an electronic module connected to an antenna is deposited within a cavity formed by said frame and said internal sheet, and a thermosetting resin is poured into this cavity, and then this cavity is covered with an upper thermoplastic sheet. The upper and lower faces of the frame, which are respectively pointed towards the upper thermoplastic sheet and towards the lower thermoplastic sheet, have an indented or alveolate relief. Consequently, the edges of the card obtained by such methods have not only an upper strip formed by the upper thermoplastic sheet and a lower strip formed by the lower thermoplastic sheet but also, between these two strips, a sinusoidal strip. The peaks of the sinusoidal strip come into contact with the upper and lower strips. The spaces contained between the sinusoidal strip and the upper and lower strips are formed by polymerized resin.

The sinusoidal strip is particularly unaesthetic. Furthermore, if we consider the indented or alveolate relief of the frame, it is possible that the resin localized in the spaces between the sinusoidal strip and the lower and upper strips may, depending on the random factors related to the cutting of the frame, be present on the sides or at the corners of the card only in a very small volume. Consequently, an impact or repeated friction on the card may lead to the chipping away of small volumes of resin and the erosion of its sides or, more particularly, its corners.

The present invention is aimed at proposing a method for the manufacture of contact-free cards that overcomes the above-mentioned drawbacks and makes it possible to obtain low-cost, aesthetically pleasing contact-free cards of homogeneous appearance.

SUMMARY OF THE INVENTION

These aims as well as others that shall appear hereinafter are achieved by means of a method for the manufacture of a contact-free card comprising a card body and an electronic module having an integrated circuit chip connected to an antenna, wherein:

- a frame is deposited on a lower thermoplastic sheet, demarcating the edges of a cavity;
- the electronic module is positioned at the bottom of said cavity;
- this cavity is filled with a polymerizable resin;
- the frame and the resin-filled cavity are covered with a second thermoplastic sheet to which slight pressure is applied/the resin is ploymerized; and
- According to a first advantageous variant of the invention, once the resin is polymerized, the card is cut out within the frame and, according to a second advantageous embodiment of the invention, a second frame determining the final thickness of the card is placed around a unit constituted by the lower sheet, frame and the upper sheet.

Furthermore, according to a preferred mode of implementing the invention designed for the batch production of cards, the method of the invention is performed with large-sized thermoplastic sheets and a frame comprising numerous windows that are positioned side by side and are each designed for the manufacture of a card.

The following description which is no way restrictive will provide for a clearer understanding of the way in which the invention can be implemented.

BRIEF DESCRIPTION OF THE DRAWINGS

It is to be read with reference to the appended drawings, of which:

FIG. 1A illustrates the depositing of a frame on a lower thermoplastic sheet and the positioning of an electronic module at the bottom of a cavity formed by said frame and said sheet, according to the method of the invention;

FIGS. 1B, 1C, 1D, 1E illustrate different variants of modules and antennas that may be implemented in the method according to the invention;

FIG. 2 illustrates the filling of the cavity with a resin according to the invention;

FIG. 3A illustrates the covering of the cavity with an upper thermoplastic sheet, the creep of the resin and the cutting out of the card according to the method of the invention;

FIG. 3B illustrates the creep of the resin according to a particular embodiment of the frame according to the method of the invention;

FIG. 4 shows the card obtained according to the method of the invention; and

FIG. 5 illustrates the method according to the invention, implemented in the batch manufacture of cards.

MORE DETAILED DESCRIPTION

For the manufacture of a contact-free card, a frame referenced 1 in FIG. 1A is placed on a lower thermoplastic sheet 2, to demarcate the edges of a cavity referenced 3 in FIG. 2.

The lower thermoplastic sheet 2 has a surface area substantially greater than that of the standardized card to be manufactured. For example, for a card with the above-mentioned standard dimensions of the ISO 7810 standard, the length of the thermoplastic sheet is about 100 mm and its width is about 69 mm. Its thickness is about 180 microns.

The frame 1 advantageously has an indented or alveolate structure whose profile has, for example, the shape of an indented or even sinusoidal band. It is preferably thermoformed out of a rectangular plastic sheet. However, it could also be made of metal, enabling it to be subsequently re-utilized if necessary. In this case, it will be partially covered with an anti-adhesive layer such as, for example, a layer of PTFE (polytetrafluoroethylene) or any other film of fluorine-based or silicon-based polymer. This layer will, before deformation, have an overall thickness of about 150 microns. After deformation, it has an overall thickness of about 400 microns, that is a thickness greater than about twice the thickness of the original layer. The frame 1 is formed by punching. It has four framing elements positioned rectangularly. This frame 1 has a length and width that are close to the length and width of the sheet 2. Now, the framing elements have a width of about 15 mm. Thus, the width and length of the cavity 3 are substantially equal to or slightly greater than the width and length of the card to be manufactured. Naturally, the indented structure is not a restrictive one and, on its edges, the frame 1 may have through holes, referenced 21 in FIG. 3B, connecting the internal edges of the frame 1 to its external edges.

While the frame 1 is placed on the thermoplastic sheet 2, the electronic module 4 is placed at the bottom of the cavity 3. FIGS. 1B to 1E show antenna-and-module assemblies according to different variants.

In FIG. 1B, the electronic module 4 advantageously comprises a substrate 5 to which there have been fixed a chip 6 and, for example, a coil 7. The coil 7 may be replaced by any other antenna-forming element with a view to an electromagnetic transmission of information elements between a reader, not shown in the figures, and the chip 6. FIG. 1C shows a circular antenna and FIGS. 1D and 1E show rectangular antennas. The chip 6 is connected to the coil 7 or, conversely, the chip 6 is positioned and then the coil 7 is positioned by means of connection terminals. Naturally, it is possible to deposit the different elements of the module 4 by successive steps on the thermoplastic sheet 2. For example, it is quite possible to conceive of a method according to which the coil 7 is positioned on the thermoplastic sheet 2 before the positioning of the chip 6 and its connection to the coil 7 or, conversely, the positioning of the chip 6 and then of the coil 7. Furthermore, the module 4 may be fixed to the thermoplastic sheet 2 by means of a drop of bonder such as, for example, a cyanoacrylate-based bonder. Although this then constitutes an additional step in the method, the module 4 is then held in a stable position. In general, the antenna 7 is positioned substantially at equal distance from the inner edges of the frame 1.

When the electronic module 4 is positioned at the bottom of the cavity 3, this cavity 3 is filled with a resin 8.

The resin 8 is advantageously dispensed into the cavity 3 from the top, by means of syringes or micropipettes whose tips are referenced 9 in FIG. 2. The volume of resin 8 dispensed is greater than the volume of the cavity 3. Thus, once the dispensing of the resin 8 is over, the cavity 3 is totally filled. During the filling, the flow of resin 8 can shift the electronic module 4 to the bottom of the cavity 3. Now, a shifting of the module 4 by more than one millimeter at the bottom of this cavity may position the antenna 7 so that it faces the edges by which the card will be cut out. Hence, it is preferable to fill the cavity 3 by delivering the resin 8 vertically, by means of a single syringe tip positioned above the module 4 and substantially at the center of the cylinder formed by the coil 7. This approach nevertheless has certain drawbacks. Indeed, the flow of resin 8 falling on the module 4 gets distributed at the bottom of the cavity 3, in the form of a circle. Since the frame is rectangular, the edges of this circle will reach the big framing elements sooner than the small framing elements. The distribution of the resin 8 in the cavity 3 will therefore not be homogeneous. Consequently, it is particularly advantageous to dispense the resin 8 vertically, at two points located at the bottom of the cavity 3, on either side and at preferably at equal distance from the module 4, and in a median plane of the frame 1, in the lengthwise direction. This will thus prevent any shifting of the module 4 and the resin 8 will, at the same time, reach all the four framing elements. This approach is shown in FIG. 2.

When the resin reaches the frame 1, it creeps through the hollows and recesses of this frame and thus drives out the air bubbles.

The resin 8 chosen is preferably a thermohardening resin that polymerizes at a temperature of less than about 60° C. and at atmospheric pressure. A resin such as this is advantageously a bi-constituent resin comprising a polyurethane that polymerizes as soon as it is mixed with a hardener. Nevertheless, the temperature will have to remain insufficient so as not to give rise to residual deformation at the interfaces of the different elements of the card.

As soon as the resin 8 has filled the cavity 3, the frame 1 is covered with an upper thermoplastic sheet 10 to which there is applied a slight pressure represented in FIG. 3A by an arrow 11. This pressure may be applied by means of two metal plates 18 and 19 that are made to approach each other. These two metal plates 18, 19 may be covered, as the case may be, by an anti-adhesive material.

The vertical pressure 11 is sufficient to drive the surplus resin 8 out of the unit formed by the sheet 2, frame 1 and sheet 10, by creeping into the recesses of the frame 1 and through these recesses. A pressure of about one bar is enough to carry out this operation properly without shifting the electronic module 4. If the frame 1 has through holes 21 connecting its internal edges with its external edges, then the creeping of the resin 8 takes place through said holes 21 (FIG. 3B).

Should the frame 1 be sufficiently rigid, it serves actually as a thickness shim by limiting the vertical shifting of the sheet 10.

However, in other cases, it is possible to place, around the above-mentioned unit, a second metal frame 17 determining the final thickness of the card. The cards obtained are then equal in thickness.

The second frame 17 demarcates a cavity 20 whose depth is advantageously equal to the thickness of the card to be obtained, namely, in practice, for a card according to the usual standard ISO 7810, equal to about 0.76 mm. Secondly, the length and width of this cavity 20 is preferably greater than the length and the width of a unit, as mentioned above, formed by the sheet 2, the frame 1 and the sheet 10. The inner edges of the second frame 17, which define the cavity 20, are then not in contact with the above-mentioned unit, and the resin 8 driven out of the unit spreads in the space between this unit and the frame 17. Naturally, it is possible to apply the second frame 17 against the unit formed by the sheet 2, the frame 1 and the sheet 10. However, the frame 17 then has, on its edge, on its inner edges, apertures enabling the creep of the resin 8. These apertures however diminish the rigidity of the second frame 17.

Once the resin 8 is polymerized, the abovementioned unit is cut out in order to obtain a card referenced 12 in FIG. 4.

The cutting out is done preferably inside the frame 1, in the cavity 3, along the lines referenced 13 which are advantageously located in the vicinity of the inner sides of the frame 1. This will reduce the quantity of plastic residues eliminated by the method of the invention.

The card obtained is a rectangular card 12 and has three thicknesses: an upper thermoplastic sheet 10, a resin layer 8 and a lower thermoplastic sheet 2. The frame 1 cannot be seen on the side edge of the card and the electronic module 4 is embedded in the polymerized resin 8.

In order to implement the method of the invention in batch manufacture, it is particularly worthwhile to use large-sized thermoplastic sheets 23 and 14 and a frame 15 having many windows 16, positioned side by side, each designed to manufacture a card. In this case, the width of the frame elements defining the size of the windows 16 should suffice to enable the creep of the resin to take place without hindrance. For example, it is possible to use 350×350 mm format thermoplastic sheets comprising sixteen windows 16 for sixteen cards.

In the case of the manufacture of combined contact-free cards, the above-described method should be complemented by a set of steps aimed at positioning a contact interface on the card 1.

What is claimed is:

1. A method for the manufacture of a contact-free card comprising a card body and an electronic module having an integrated circuit chip connected to an antenna, wherein:
    a frame is deposited on a lower thermoplastic sheet, thereby demarcating the edges of a cavity;
    the electronic module is positioned at the bottom of said cavity;
    this cavity is filled with a polymerizable resin;
    the frame and the resin-filled cavity are covered with an upper thermoplastic sheet to which slight pressure is applied;
    the resin is polymerized; and
    the card is cut out within the frame.

2. A method according to claim 1, wherein the upper and lower sheets are large-sized plastic sheets and the frame includes several windows that are positioned side by side add arc each designed for the manufacturer of one card.

3. A method according to claim 1, wherein said pressure is applied by causing two metal plates to approach one another, the lower sheet, the frame, and the upper sheet being disposed between said metal plates.

4. A method according to claim 1, wherein the electronic module is positioned at the bottom of the cavity with bonding.

5. A method according to claim 1, wherein the resin is dispensed into the cavity through the top of this cavity.

6. A method according to claim 1, wherein the resin is dispensed into the cavity perpendicular to the bottom of the cavity.

7. A method according to claim 1, wherein the resin is dispensed at two points located at the bottom of said cavity on either side of the module in the median plane of the frame, in the lengthwise direction.

8. A method according to claim 1, wherein the polymerization temperature of the resin is lower than about 60° C. at atmospheric pressure.

9. A method according to claim 1, wherein the resin used is a bi-constituent polyurethane resin.

10. A method according to claim 1, wherein the pressure applied to the second sheet is about one bar.

11. A method according to claim 1, wherein the top and bottom faces of the frame have an alveolate structure in order to enable the creeping of the resin under the effect of the pressure applied.

12. A method for the manufacture of a contact-free card comprising a card body and an electronic module having an integrated circuit chip connected to an antenna, wherein:
    a frame is deposited on a lower thermoplastic shift, thereby demarcating the edges of a cavity, wherein the frame has through holes connecting the inner edges of said frame to its outer edges;
    the electronic module is positioned at the bottom of said cavity;
    this cavity is filled with a polymerizable resin:
    the frame and the resin-filled cavity are covered with an upper thermoplastic sheet to which slight pressure is applied; and
    the resin is polymerized.

13. A method for the manufacture of a contact-free card comprising a card body and an electronic module having an integrated circuit chip connected to an antenna, wherein:
    a frame is deposited on a lower thermoplastic sheet thereby demarcating the edges of a cavity;
    the electronic module is positioned at the bottom of said cavity;
    the cavity is filled with a polymerizable resin;
    the frame and the resin-filled cavity are covered with an upper thermoplastic sheet;
    a second frame determining the final thickness of the card is placed around a unit constituted by the lower sheet, the frame, and the upper sheet;
    slight pressure is applied to said upper thermoplastic sheet; and
    the resin is polymerized, whereto the second frame demarcates a cavity whose width and length are greater than the width and length of the unit formed by the lower sheet, the frame, and the upper sheet.

14. A method of manufacturing a contact-free or a hybrid card comprising a card body and an electronic module, said electronic module comprising an antenna and an integrated circuit chip connected to said antenna, said method comprising:

(A) depositing a frame on a lower thermoplastic sheet, said frame demarcating edges of a cavity, said cavity having a bottom;

(B) positioning said electronic module at the bottom of said cavity;

(C) filling said cavity with a polymerizable resin;

(D) covering said resin-filled cavity and said frame with an upper thermoplastic sheet;

(E) applying slight pressure m said upper sheet;

(F) polymerizing said resin; and (G) cutting said card out within said frame.

15. A method according to claim 14, wherein said lower sheet, said frame, and said upper sheet constitute a unit, and further comprising placing a second frame around said unit, said second frame determining the final thickness of said card, and wherein said second frame demarcates a cavity whose depth is equal to the thickness of said card.

* * * * *